(12) United States Patent
Lai et al.

(10) Patent No.: US 10,770,429 B2
(45) Date of Patent: Sep. 8, 2020

(54) MICROELECTRONIC DEVICE STACKS HAVING INTERIOR WINDOW WIREBONDING

(71) Applicant: INTEL CORPORATION, Santa Clara, CA (US)

(72) Inventors: Min-Tih Lai, Orangevale, CA (US); Cory A. Runyan, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 19 days.

(21) Appl. No.: 16/096,392

(22) PCT Filed: May 31, 2016

(86) PCT No.: PCT/US2016/034955
§ 371 (c)(1),
(2) Date: Oct. 25, 2018

(87) PCT Pub. No.: WO2017/209724
PCT Pub. Date: Dec. 7, 2017

(65) Prior Publication Data
US 2019/0139936 A1 May 9, 2019

(51) Int. Cl.
*H01L 23/48* (2006.01)
*H01L 25/065* (2006.01)
(Continued)

(52) U.S. Cl.
CPC .......... *H01L 25/0652* (2013.01); *H01L 24/06* (2013.01); *H01L 24/32* (2013.01);
(Continued)

(58) Field of Classification Search
CPC ..... H01L 25/0652; H01L 24/48; H01L 24/06; H01L 24/32; H01L 24/85; H01L 24/94
See application file for complete search history.

(56) References Cited

U.S. PATENT DOCUMENTS

2007/0023886 A1* 2/2007 Hedler ................. H01L 23/481
257/686
2010/0123215 A1 5/2010 Pan et al.
(Continued)

OTHER PUBLICATIONS

International Preliminary Report on Patentability for International Patent Application No. PCT/US16/34955, dated Dec. 13, 2018.
(Continued)

*Primary Examiner* — Phuc T Dang
(74) *Attorney, Agent, or Firm* — Green, Howard & Mughal LLP

(57) ABSTRACT

A microelectronic package may be fabricated having a microelectronic die stack attached to a microelectronic substrate, wherein a first microelectronic die within the microelectronic die stack includes an opening or "window" formed therethrough. The first microelectronic die may be in electronic communication with a second microelectronic die within microelectronic die stack and/or in electrical communication with a microelectronic substrate upon which the microelectronic die stack may be attached, wherein the electronic communication may be created with a bond wire which extends through the opening or "window" in the first microelectronic die.

15 Claims, 8 Drawing Sheets

(51) Int. Cl.
  *H01L 23/00* (2006.01)
  *H01L 29/06* (2006.01)
  *H01L 25/00* (2006.01)

(52) U.S. Cl.
  CPC .............. *H01L 24/48* (2013.01); *H01L 24/85* (2013.01); *H01L 24/94* (2013.01); *H01L 25/0657* (2013.01); *H01L 25/50* (2013.01); *H01L 29/0657* (2013.01); *H01L 24/05* (2013.01); *H01L 24/29* (2013.01); *H01L 24/73* (2013.01); *H01L 24/92* (2013.01); *H01L 2224/05554* (2013.01); *H01L 2224/2919* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/73265* (2013.01); *H01L 2225/06506* (2013.01); *H01L 2225/06562* (2013.01); *H01L 2924/00014* (2013.01); *H01L 2924/10155* (2013.01); *H01L 2924/15311* (2013.01)

(56) References Cited

U.S. PATENT DOCUMENTS

| | | |
|---|---|---|
| 2011/0024745 A1 | 2/2011 | Hembree et al. |
| 2012/0009736 A1 | 1/2012 | Yang et al. |
| 2012/0068342 A1* | 3/2012 | Lee .................. H01L 21/76898 257/746 |
| 2014/0159220 A1 | 6/2014 | Willkofer et al. |

OTHER PUBLICATIONS

International Search Report and Written Opinion for International Patent Application No. PCT/US16/34955, dated Feb. 27, 2017.

* cited by examiner

MICROELECTRONIC DEVICE STACKS HAVING INTERIOR WINDOW WIREBONDING

CLAIM OF PRIORITY

This Application is a National Stage Entry of, and claims priority to, PCT Application No. PCT/US16/34955, filed on May 31, 2016 and titled "MICROELECTRONIC DEVICE STACKS HAVING INTERIOR WINDOW WIREBONDING", which is incorporated by reference in its entirety for all purposes.

TECHNICAL FIELD

Embodiments of the present description generally relate to the field of microelectronic packaging, and, more particularly, to a microelectronic packages having at least one microelectronic device stack, wherein a first microelectronic device within the microelectronic device stack is in electronic communication with a second microelectronic device within microelectronic device stack and/or in electrical communication with a microelectronic substrate upon which the first microelectronic device is stacked with a bond wire which extends through an opening or "window" formed through the first microelectronic device.

BACKGROUND

The microelectronic industry is continually striving to produce ever faster, smaller, and thinner microelectronic packages for use in various electronic products, including, but not limited to, computer server products and portable products, such as wearable microelectronic systems, portable computers, electronic tablets, cellular phones, digital cameras, and the like.

One way to achieve these goals is by increasing integration density, such as by stacking components within the microelectronic package. One stacking method may comprise a method typically used in NAND memory die stacking, wherein a plurality of wirebond pads are formed along one edge of each of the NAND memory dice. The NAND memory dice are stacked on a microelectronic substrate in a staggered or zig-zag configuration to allow access to the wirebond pads. Bond wires are then used to form electrical connections between the wirebond pads on various NAND memory dice and/or between the NAND memory dice and the microelectronic substrate. Although this stacking method allows for flexibility and choice in wirebond pad location, the longest distance for a transmission line to a corresponding wirebond pad location within each NAND memory die may be the entire length of the NAND memory die. This may result in signal degradation due to impedance.

Another stacking method may comprise the use of through-silicon vias wherein signal lines are formed in and through the stacked NAND memory dice to form connections therebetween, as will be understood to those skilled in the art. Through-silicon vias allow for very short conductor paths between the NAND memory dice and the microelectronic substrate, and longest distance for a transmission line to a corresponding wirebond pad location within each NAND memory die may be a fraction of the length of the NAND memory die. However, the use of through-silicon vias requires an increased number of expensive wafer level processing steps, and may cause reliability issues from copper processing temperature, volume expansion during annealing, and ion migration. Further, the use of through-silicon vias does not allow for flexibility in the positioning of the through-silicon vias within the individual microelectronic dice, as the connection must be made straight down through the microelectronic die stack.

Therefore, there is a need to develop novel microelectronic die stacking configurations and designs to reduce signal transmission lengths, minimize costs, and improve reliability.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
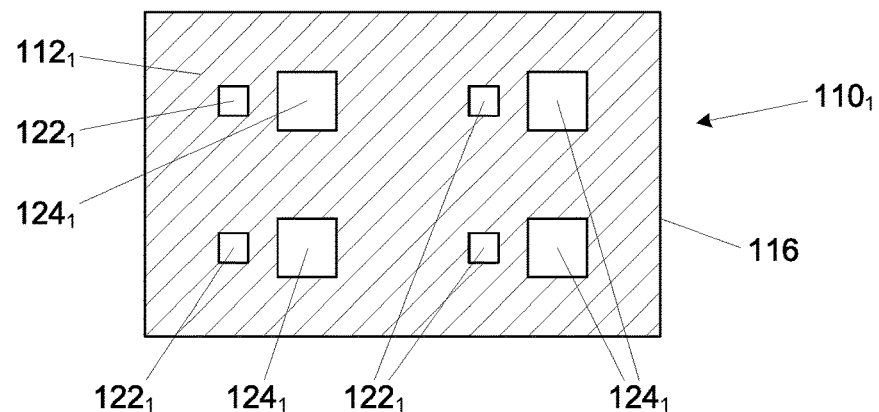
FIG. 1 illustrates a top plan view of a microelectronic die having at least one opening defined therethrough, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description may include a microelectronic package having a microelectronic die stack attached to a microelectronic substrate, wherein a first microelectronic die within the microelectronic die stack includes an opening or "window" formed therethrough. The first microelectronic die may be in electronic communication with a second microelectronic die within microelectronic die stack and/or in electrical communication with a microelectronic substrate upon which the microelectronic die stack may be attached, wherein the electronic communication may be created with a bond wire which extends through the opening or "window" in the first microelectronic die.

For the purposes of the present invention the term "microelectronic device" may include microelectronic dice, microelectronic substrates, and microelectronic wafers, as will be discussed.

FIG. 1 illustrates a first microelectronic die $110_1$ having a first surface $112_1$ with at least one bond pad $122_1$ formed in or on the first microelectronic die first surface $112_1$. The first microelectronic die $110_1$ may also include at least one opening or window $124_1$ formed through the first microelectronic die $110_1$. It is understood that the openings $124_1$ do not include notches, as they are defined within the first microelectronic die $110_1$ and do not extend from a side $116_1$ of the first microelectronic die $110_1$.

Figure 2:
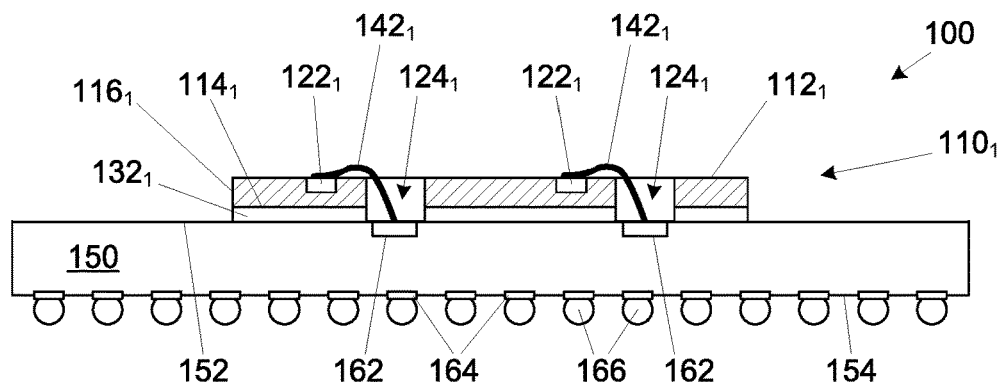
FIG. 2 illustrates a side cross-sectional view of a microelectronic package including the microelectronic die of FIG. 1, according to one embodiment of the present description.

FIG. 2 illustrates the first microelectronic die $110_1$ of FIG. 1 attached to a microelectronic substrate 150 to form a microelectronic package 100. The first microelectronic die $110_1$ may be attached to the microelectronic substrate 150 with a first die attach adhesive layer $132_1$ disposed between a second surface $114_1$ of the first microelectronic die $110_1$ and a first surface 152 of the microelectronic substrate 150. The microelectronic substrate 150 may include at least one bond pad 162 formed in or one the microelectronic structure first surface 152 and at least one interconnect bond pad 164 formed in or on a second surface 154 of the microelectronic substrate 150, wherein interconnects 166, such as solder balls, may be attached to each microelectronic substrate interconnect bond pad 164.

As further illustrated in FIG. 2, the first microelectronic die openings $124_1$ may extend through the first microelectronic die $110_1$ from the first microelectronic die first surface $112_1$ to the first microelectronic die second surface $114_1$. The first microelectronic die bond pads $122_1$ may be electrically connected to corresponding microelectronic substrate bond pads 162 with first bond wires $142_1$ extending through corresponding first microelectronic die openings $124_1$.

The microelectronic substrate 150 may comprise any appropriate dielectric material, including, but not limited to, liquid crystal polymer, epoxy resin, bismaleimide triazine resin, FR4, polyimide materials, and the like, and may include conductive routes (not shown) formed therein and/or thereon to form any desired electrical route within the microelectronic substrate 150.

Figure 3:
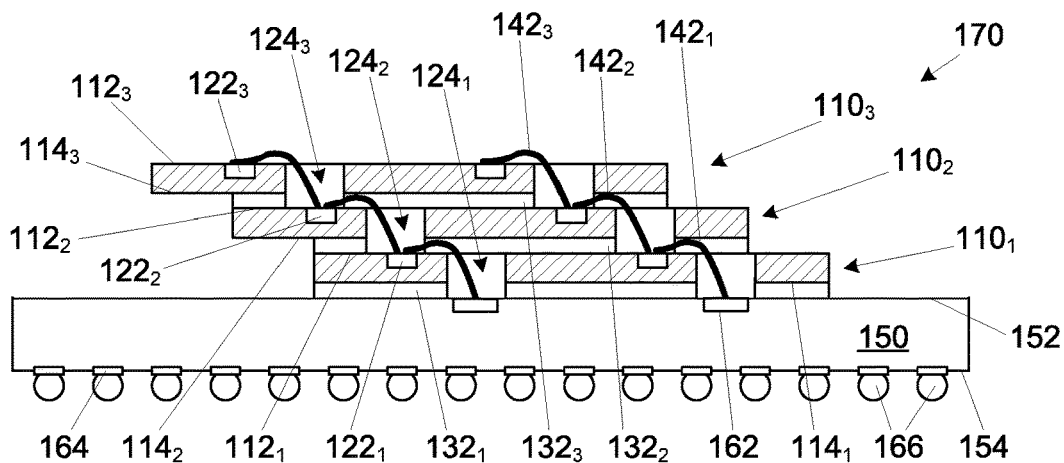
FIG. 3 illustrates a side cross-sectional view of a microelectronic package including the microelectronic die of FIG. 1, according to another embodiment of the present description.

Additional microelectronic dice may be stacked on the first microelectronic die $110_1$ to form a microelectronic package 170. As shown in FIG. 3, a second microelectronic die $110_2$ may be attached to the first microelectronic die $110_1$ with a second die attach adhesive layer $132_2$ disposed between a second surface $114_2$ of the second microelectronic die $110_2$ and the first microelectronic die first surface $112_1$. The second microelectronic die $110_2$ may have a first surface $112_2$ with at least one bond pad $122_2$ formed in or on the second microelectronic die first surface $112_2$. The second microelectronic die $110_2$ may also include at least one opening or window $124_2$ formed through the second microelectronic die $110_2$. The second microelectronic die bond pads $122_2$ may be electrically connected to corresponding first microelectronic die bond pads $122_1$ with second bond wires $142_2$ extending through corresponding second microelectronic die openings $124_2$.

As further shown in FIG. 3, a third microelectronic die $110_3$ may be attached to the second microelectronic die $110_2$ with a third die attach adhesive layer $132_3$ disposed between a second surface $114_3$ of the third microelectronic die $110_3$ and the second microelectronic die first surface $112_2$. The third microelectronic die $110_3$ may have a first surface $112_3$ with at least one bond pad $122_3$ formed in or on the third microelectronic die first surface $112_3$. The third microelectronic die $110_3$ may also include at least one opening or window $124_3$ formed through the third microelectronic die $110_3$. The third microelectronic die bond pads $122_3$ may be electrically connected to corresponding second microelectronic die bond pads $122_2$ with third bond wires $142_3$ extending through corresponding third microelectronic die openings $124_3$.

The first microelectronic die $110_1$, the second microelectronic die $110_2$, and/or the third microelectronic die $110_3$, may be any appropriate microelectronic device, including, but not limited to, microprocessors, chipsets, graphics devices, wireless devices, memory devices, application specific integrated circuit devices, and the like. In a specific embodiment, the first microelectronic die $110_1$, the second microelectronic die $110_2$, and/or the third microelectronic die $110_3$, may be non-volatile memory devices.

Figure 4:
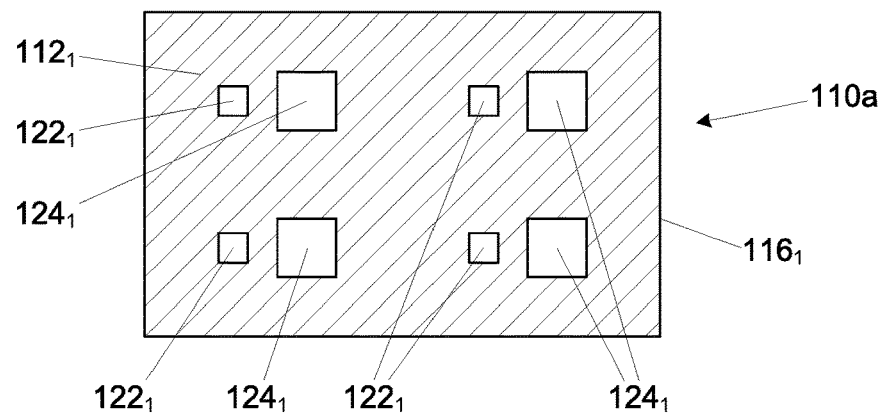
FIGS. 4 and 5 illustrate top plan views of microelectronic dice having openings defined therethrough, according to still another embodiment of the present description.
Figure 5:
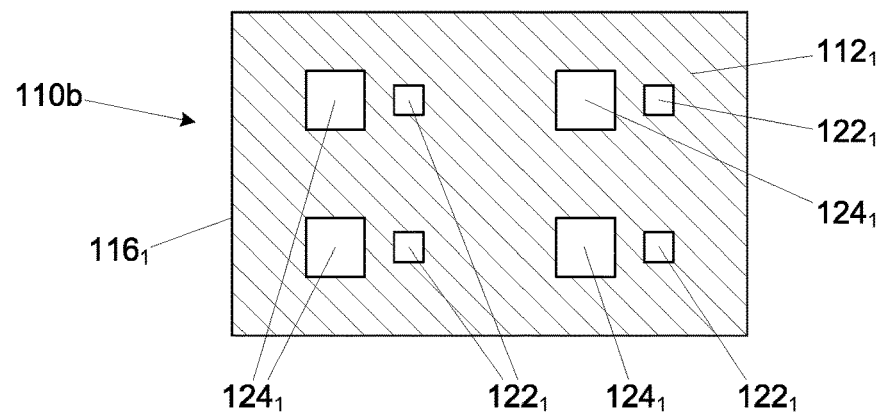

In another embodiment, as shown in FIG. 4, one microelectronic die 110a may be formed in the manner described with regard to the first microelectronic die $110_1$ in FIG. 2. As shown in FIG. 5, another microelectronic die 110b may also be formed in the manner described with regard to first microelectronic die $110_1$ in FIG. 2, but in a substantially mirror-image configuration to the microelectronic die 110a. It is understood that, if the bond pads $122_1$ and the openings $124_1$ of FIG. 4 are appropriately positioned, the mirror-image configuration of microelectronic die 110b of FIG. 5 may be achieved by rotating the microelectronic die 110a of FIG. 4 by 180 degrees.

Figure 6:
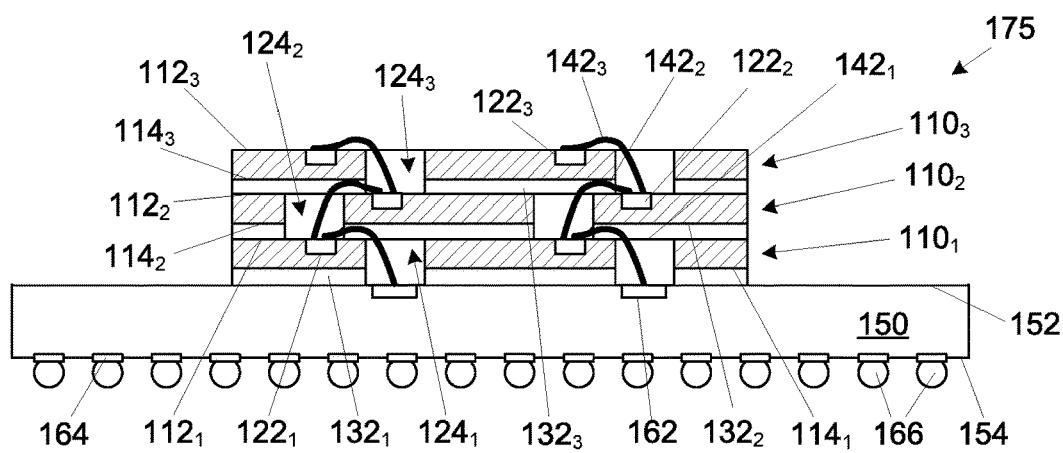
FIG. 6 illustrates a side cross-sectional view of a microelectronic package including the microelectronic dice of FIGS. 4 and 5, according to one embodiment of the present description.

As shown in FIG. 6, the one microelectronic die 110a of FIG. 4 and the other microelectronic die 110b of FIG. 5 may be stacked in an alternating fashion, wherein the first microelectronic die $110_1$ and the third microelectronic die $110_3$ corresponds to the one microelectronic die 110a of FIG. 4 and wherein the second microelectronic die $110_2$ corresponds to the other microelectronic die 110b of FIG. 5 to from a microelectronic package 175. The components of the microelectronic package 175 of FIG. 6 may be assembled in the manner discussed with regard to the microelectronic package 170 of FIG. 3. As will be understood to those skilled in the art, the stacking configuration of FIG. 6 will result in a small footprint than that of FIG. 3.

Figure 7:
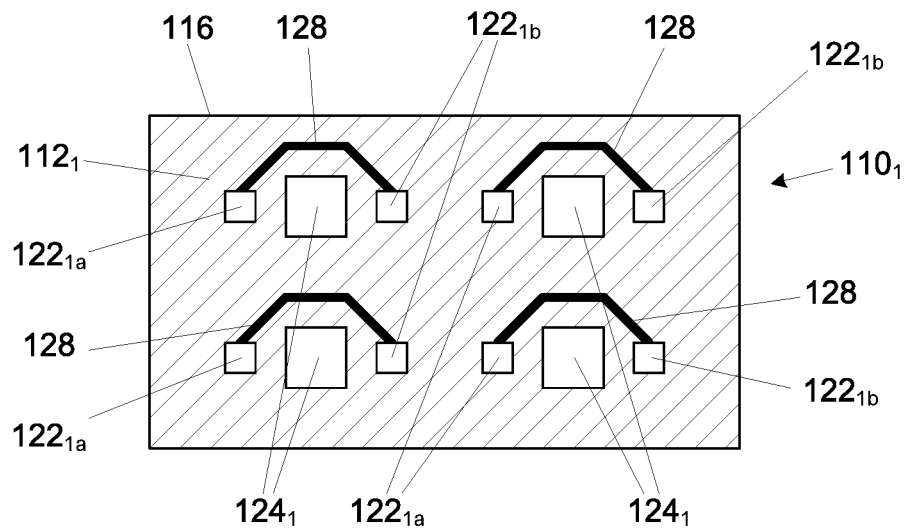
FIG. 7 illustrates a top plan view of a microelectronic die having at least one opening defined therethrough, according to an embodiment of the present description.
Figure 8:
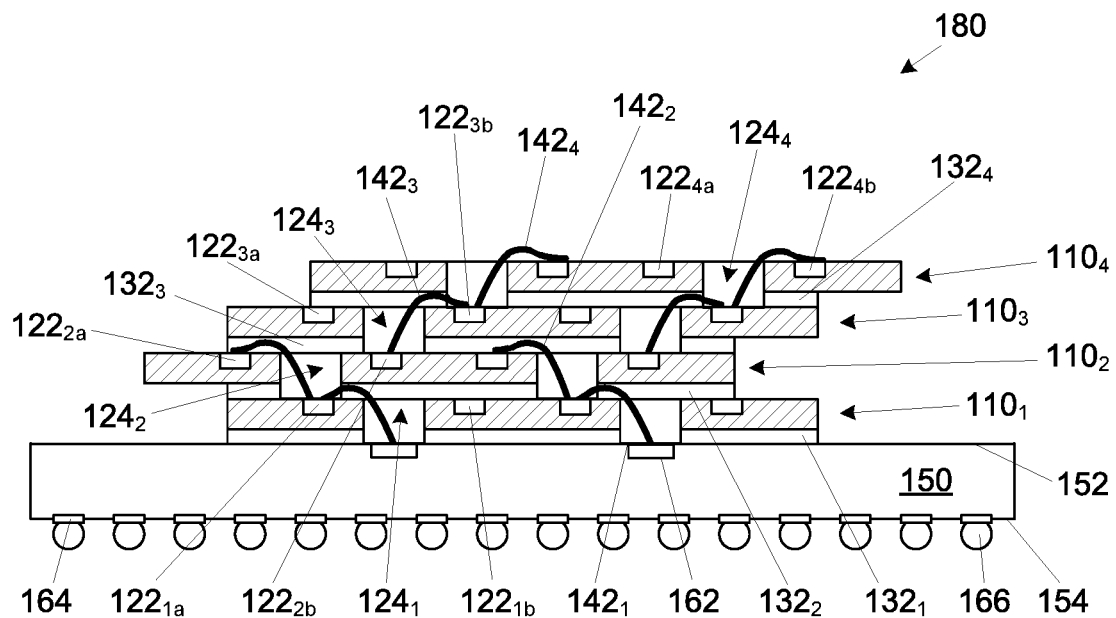
FIG. 8 illustrates a side cross-sectional view of a microelectronic package including the microelectronic die of FIG. 7, according to one embodiment of the present description.

In a further embodiment, as shown in FIGS. 7 and 8, the first microelectronic die $110_1$ may be formed with a pair of bond pads $122_{1a}$ and $122_{1b}$ which are positioned on opposing sides of an associated opening $124_1$, wherein the first bond pad $122_{1a}$ and the second bond pad $122_{1b}$ of each pair of pads are shorted together with a conductive trace 128. Thus, when the first microelectronic die $110_1$, the second microelectronic die $110_2$, the third microelectronic die $110_3$, and a fourth microelectronic die $110_4$ are assembled in the manner discussed with regard to the microelectronic package 170 of FIG. 3 to form a microelectronic package 180, there is a choice of which bond pad $122_{1a}$, $122_{1b}$ to use to minimize the footprint of the microelectronic package 180, as will be understood to those skilled in the art.

Figure 9:
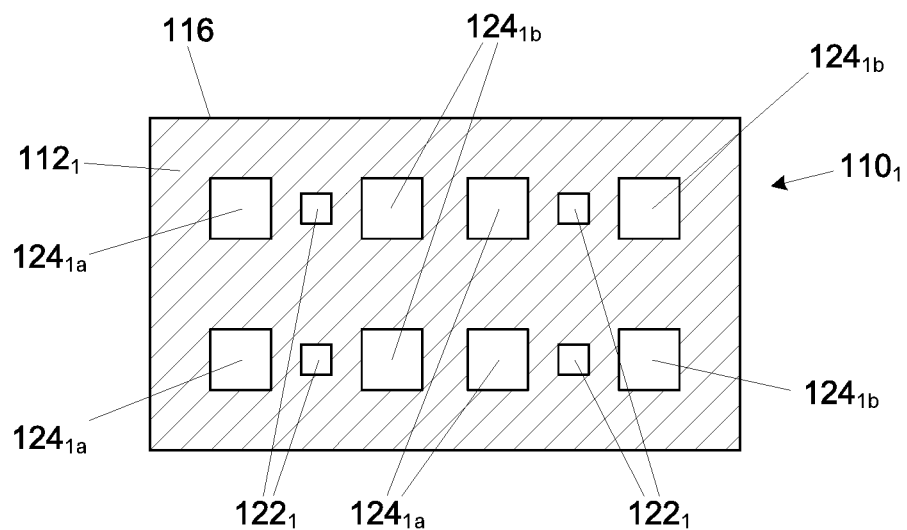
FIG. 9 illustrates a top plan view of a microelectronic die having at least one opening defined therethrough, according to an embodiment of the present description.
Figure 10:
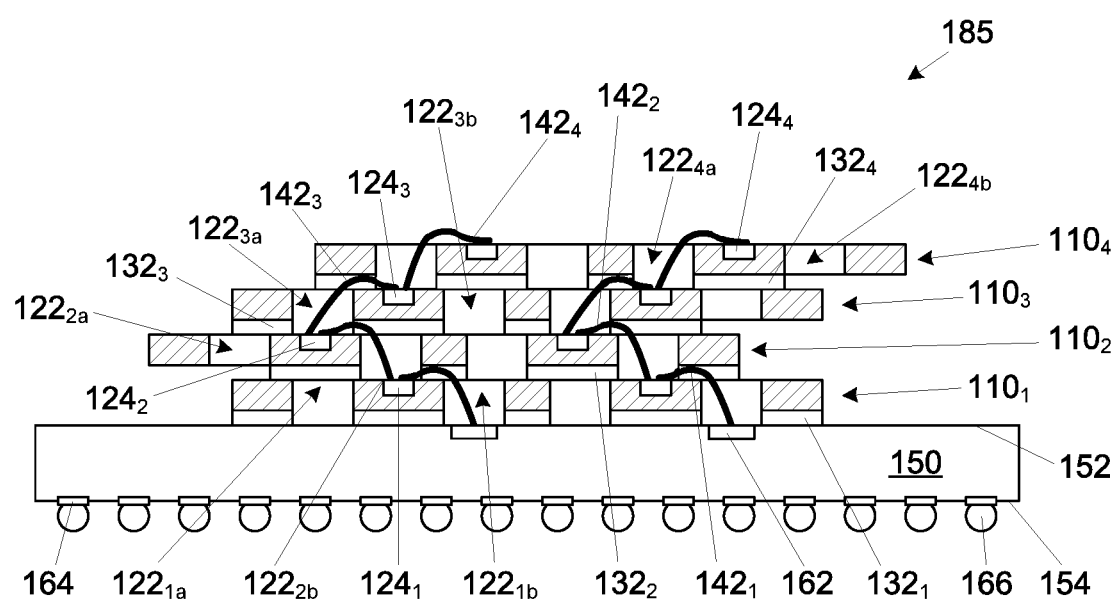
FIG. 10 illustrates a side cross-sectional view of a microelectronic package including the microelectronic die of FIG. 9, according to one embodiment of the present description.

In still a further embodiment, as shown in FIGS. 9 and 10, the first microelectronic die $110_1$ may be formed with a pair of openings $124_{1a}$ and $124_{1b}$ which are positioned on opposing sides of an associated bond pad $122_1$. Thus, as shown in FIG. 10, when the first microelectronic die $110_1$, the second microelectronic die $110_2$, the third microelectronic die $110_3$, and the fourth microelectronic die $110_4$ are assembled in the manner discussed with regard to the microelectronic package 170 of FIG. 3 to form a microelectronic package 185, there is a choice of which opening $124_{1a}$, $124_{1b}$ to use to minimize the footprint of the microelectronic package 185.

Figure 11:
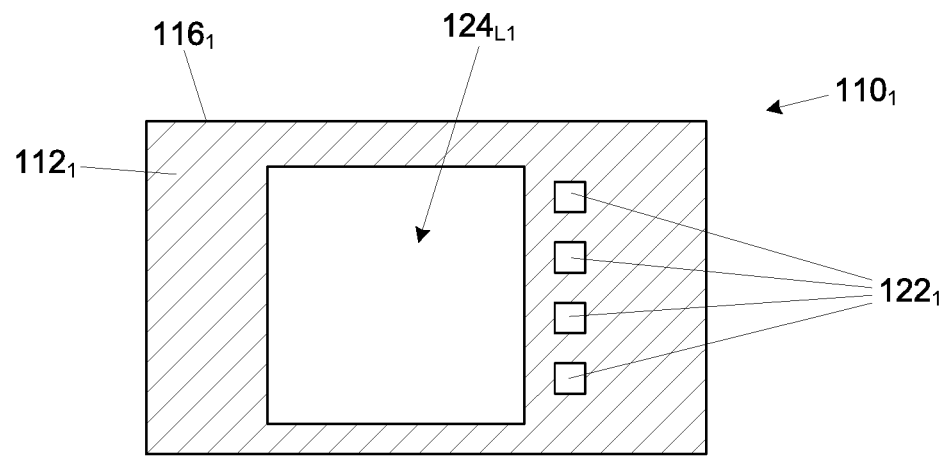
FIG. 11 illustrates a top plan view of a microelectronic die having an opening defined therethrough, according to an embodiment of the present description.
Figure 12:
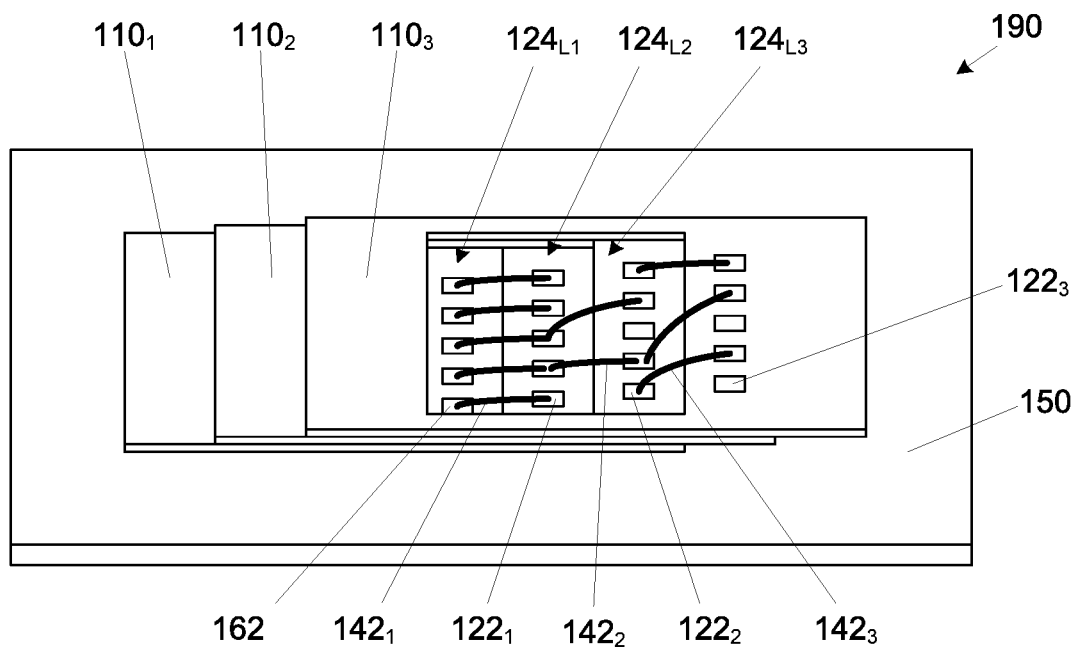
FIG. 12 illustrates a side cross-sectional view of a microelectronic package including the microelectronic die of FIG. 11, according to one embodiment of the present description.

As will understood to those skilled in the art, the embodiment of FIGS. 1-10 require that the attachment of the wire bonds (elements $142_1$, $142_2$, $142_3$, etc.) be completed after that attachment of each microelectronic die (elements $110_1$, $110_2$, $110_3$, etc.) in sequence, respectively. In an embodiment of the present description, as shown in FIGS. 11, and 12, at least one large opening $124_{L1}$ may be formed in the microelectronic dice, such as the first microelectronic die $110_1$ of FIG. 11. The microelectronic dice, such as the first microelectronic die $110_1$, the second microelectronic die $110_2$, and the third microelectronic die $110_3$ shown in FIG. 12, may be stacked on the microelectronic substrate 150, such that the large openings, such openings $124_{L1}$, $124_{L2}$, and $124_{L3}$, respectively, allow access to all of the bond pads, such bond pads 162, $122_1$, $122_2$, and $122_4$, for the attachment of the wire bonds, such as bond wires $142_1$, $142_2$, and $142_3$, after the stacking of the microelectronic dice, to form a microelectronic package 190.

Figure 13:
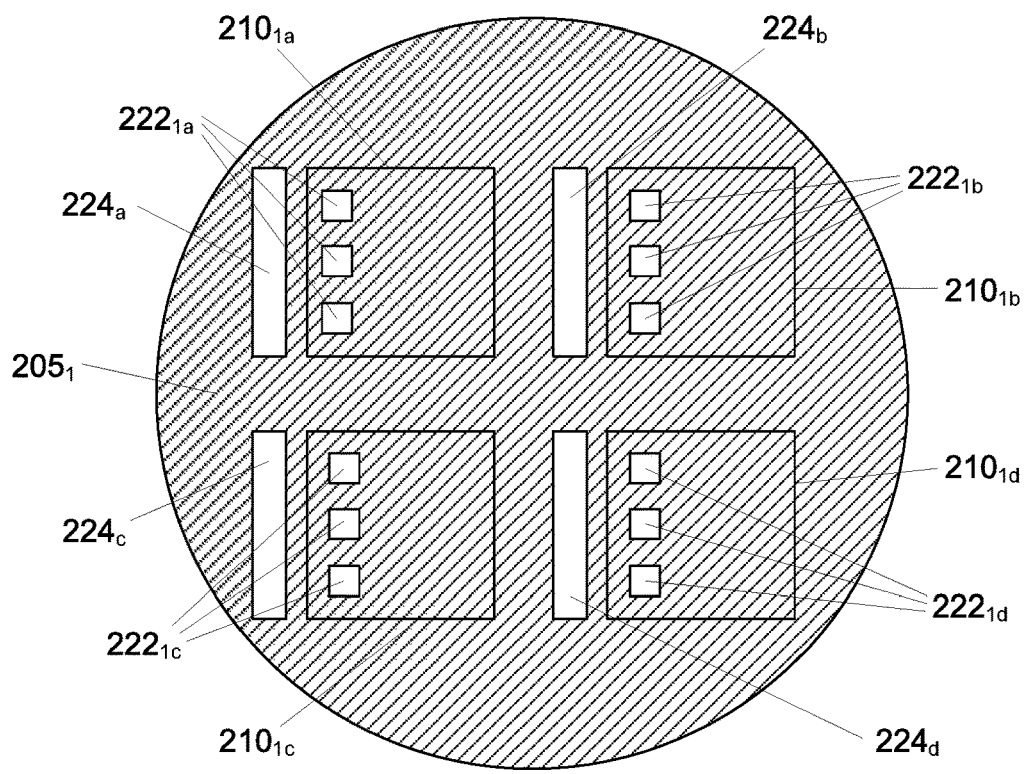
FIG. 13 illustrates a top plan view of a microelectronic wafer having at least one microelectronic die area and at least one opening defined therethrough, according to an embodiment of the present description.
Figure 14:
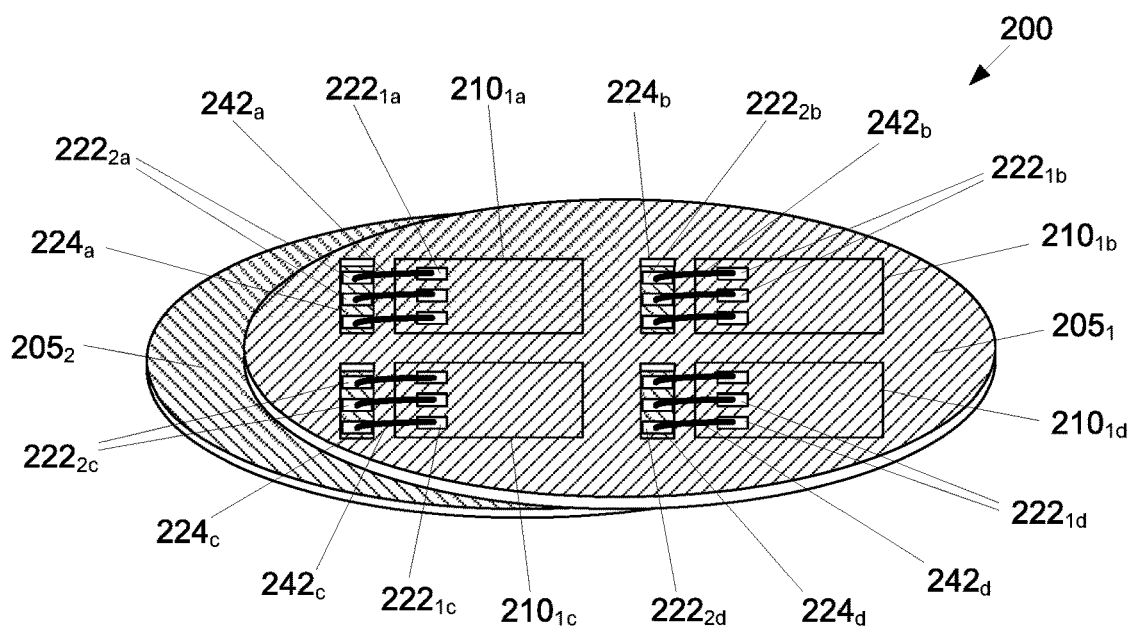
FIG. 14 illustrates an oblique view of a wafer level microelectronic package including the microelectronic wafer of FIG. 13, according to one embodiment of the present description.

In another embodiment of the present description, the subject matter can be applied on a wafer level. As shown in FIG. 13, a plurality of microelectronic die areas $210_{1a}$, $210_{1b}$, $210_{1c}$, and $210_{1d}$ may be formed in a first microelectronic wafer $205_1$, wherein each of the microelectronic die areas include at least one bond pad, e.g. elements $222_{1a}$, $222_{1b}$, $222_{1c}$, and $222_{1d}$, respectively. At least one opening $224_a$, $224_b$, $224_c$, and $224_d$ may be formed adjacent each of the microelectronic die areas $210_{1a}$, $210_{1b}$, $210_{1c}$, and $210_{1d}$, respectively. As shown in FIG. 14, the first microelectronic wafer $205_1$ may be stacked on a second microelectronic wafer $205_2$ in a manner previously discuss, and at least one bond wire $242_a$, $242_b$, $242_c$, and $242_d$ may extend through their respective openings $224_a$, $224_b$, $224_c$, and $224_d$ to connect the bond pads $222_{1a}$, $222_{1b}$, $222_{1c}$, and $222_{1d}$ on the first microelectronic wafer $205_1$ to corresponding bond pads $222_{2a}$, $222_{2b}$, $222_{2c}$, and $222_{2d}$ on the second microelectronic wafer $205_2$ to form a wafer level microelectronic package 200. As shown in FIGS. 13 and 14, the openings $224_a$, $224_b$, $224_c$, and $224_d$ need not be within the microelectronic die areas $210_{1a}$, $210_{1b}$, $210_{1c}$, and $210_{1d}$.

Figure 15:
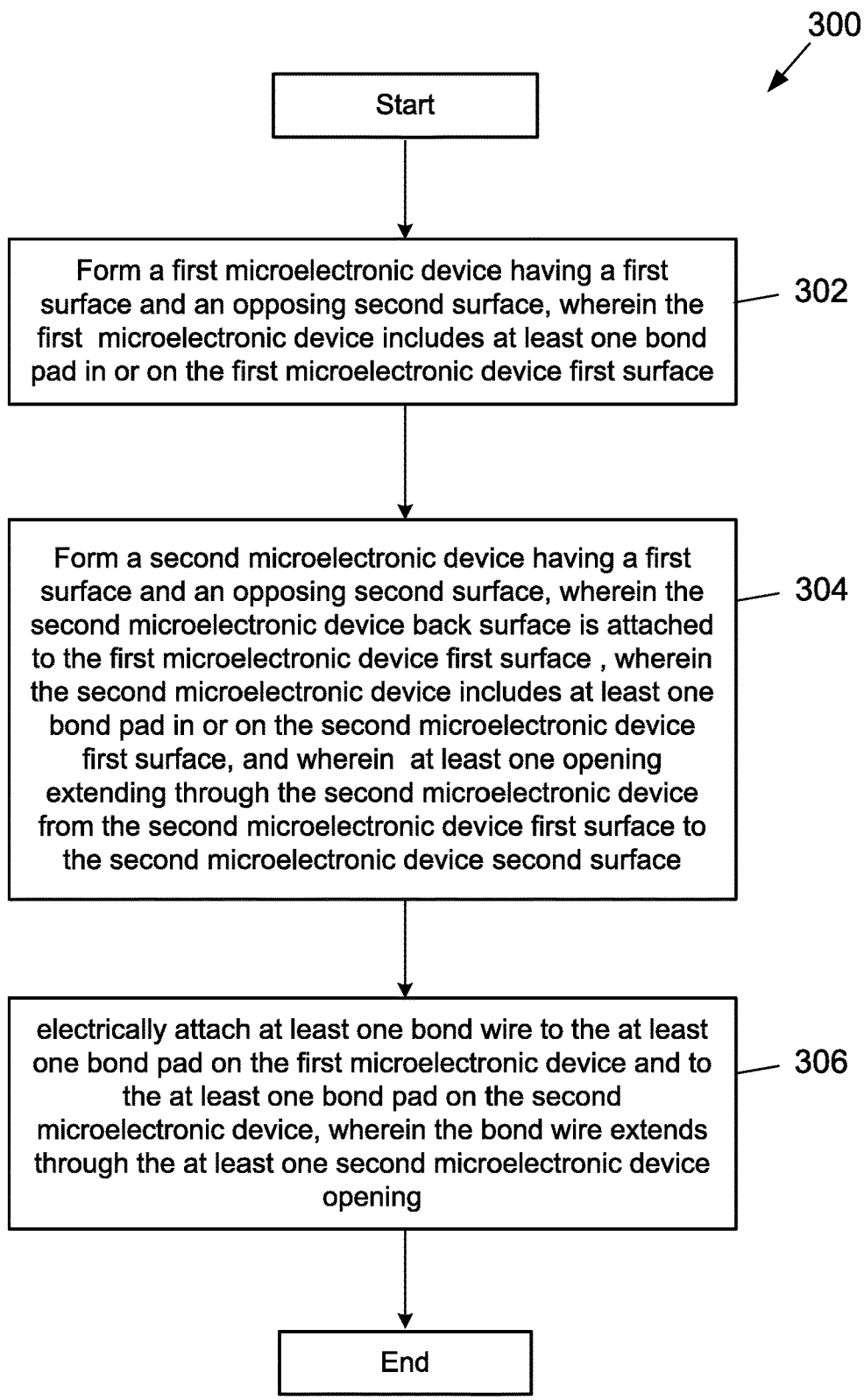
FIG. 15 is a flow diagram of a process of fabricating a microelectronic package, according to an embodiment of the present description.

FIG. 15 is a flow chart of a process 300 of fabricating a microelectronic package according to an embodiment of the present description. As set forth in block 302, a microelectronic substrate having a first surface and an opposing second surface may be formed, wherein the first microelectronic device includes at least one bond pad in or on the first microelectronic device first surface. A second microelectronic device having a first surface and an opposing second surface may be formed, wherein the second microelectronic device second surface is attached to the first microelectronic device first surface, wherein the second microelectronic device includes at least one bond pad in or on the second microelectronic device first surface, and wherein at least one opening extending through the first microelectronic device from the second microelectronic device first surface to the first microelectronic device second surface, as set forth in block 304. As set forth in block 306, at least one bond wire may be electrically attached to the at least one bond pad on the first microelectronic device and to the at least one bond pad on the second microelectronic device, wherein the bond wire extends through the at least one second microelectronic device opening.

Figure 16:
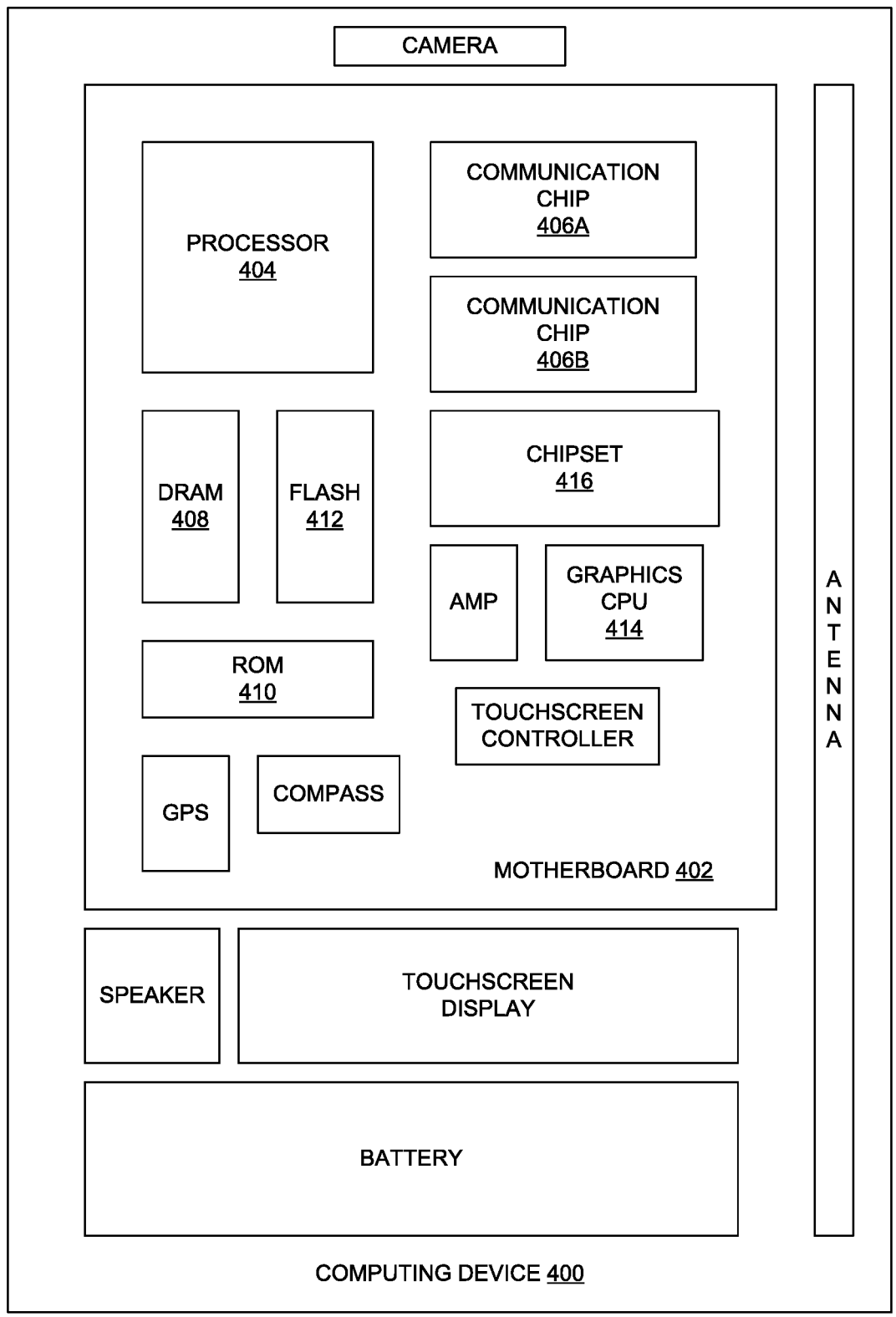
FIG. 16 illustrates a computing device in accordance with one implementation of the present description.

FIG. 16 illustrates a computing device 400 in accordance with one implementation of the present description. The computing device 400 houses a board 402. The board may include a number of microelectronic components, including but not limited to a processor 404, at least one communication chip 406A, 406B, volatile memory 408, (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 402. In some implementations, at least one of the microelectronic components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 400 may include a microelectronic package having a microelectronic die stack attached to microelectronic substrate, wherein a first microelectronic die within the microelectronic die stack includes an opening, wherein the first microelectronic die electrically connected with a second microelectronic die within microelectronic die stack and/or with a microelectronic substrate upon which the microelectronic die stack may be attached with a bond wire extending through the opening in the first microelectronic die.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-16. The subject matter may be applied to other microelectronic devices and assembly applications, as well as any appropriate electronic application, as will be understood to those skilled in the art.

The follow examples pertain to further embodiments and specifics in the examples may be used anywhere in one or more embodiments, wherein Example 1 is a microelectronic package, comprising a first microelectronic device having a first surface and an opposing second surface, wherein the first microelectronic device includes at least one bond pad in or on the first microelectronic device first surface; a second microelectronic device having a first surface and an opposing second surface, wherein the second microelectronic device second surface is attached to the first microelectronic device first surface, wherein the second microelectronic device includes at least one bond pad in or on the second microelectronic device first surface, and wherein at least one opening extends through the second microelectronic device from the second microelectronic device first surface to the second microelectronic device second surface; and at least one bond wire electrically attached to the at least one bond pad on the first microelectronic device and to the at least one bond pad on the second microelectronic device, wherein the bond wire extends through the at least one second microelectronic device opening.

In Example 2, the subject matter of Example 1 can optionally include the at least one bond pad in or on the second microelectronic device first surface comprising a pair of bond pads on opposing sides of the at least one opening, and wherein the pair of bond pads are shorted with a conductive trace extending between the pair of bond pads.

In Example 3, the subject matter of Example 1 can optionally include the at least one opening through the second microelectronic device comprises a pair of openings on opposing sides of the at least one bond pad of the second microelectronic device, and wherein the at least one bond wire extends through one opening of the pair of openings.

In Example 4, the subject matter of Example 1 can optionally include the at least one bond pad in or on the first microelectronic device first surface comprising a plurality of bond pads; the at least one bond pad of the second microelectronic device comprising a plurality of bond pads and wherein the opening through the second microelectronic device comprises a single opening; and the at least one bond wire comprising a plurality of bond wires, wherein the plurality of bond wires extend through the single opening to form electrical connections between the plurality of bond pads in or on the first microelectronic device first surface and corresponding bond pads of the plurality bond pads in or on the second microelectronic device first surface.

In Example 5, the subject matter of any of Examples 1 to 4 can optionally include the first microelectronic device comprising a first microelectronic die and wherein the second microelectronic device comprises a second microelectronic die.

In Example 6, the subject matter of any of Examples 1 to 4 can optionally include the first microelectronic device comprising a microelectronic substrate and wherein the second microelectronic device comprises a microelectronic die.

In Example 7, the subject matter of any of Examples 1 to 4 can optionally include the first microelectronic device comprising a first microelectronic wafer and wherein the second microelectronic device comprises a second microelectronic wafer.

In Example 8, the subject matter of Example 7 can optionally include the at least one opening being outside a microelectronic die area on the second microelectronic wafer.

In Example 9, a method of fabricating a microelectronic package may comprise forming a first microelectronic device having a first surface and an opposing second surface, wherein the first microelectronic device includes at least one bond pad in or on the first microelectronic device first surface; forming a second microelectronic device having a first surface and an opposing second surface, wherein the second microelectronic device second surface is attached to the first microelectronic device first surface, wherein the second microelectronic device includes at least one bond pad in or on the second microelectronic device first surface, and wherein at least one opening extending through the second microelectronic device from the second microelectronic device first surface to the second microelectronic device second surface; and electrically attaching at least one bond wire to the at least one bond pad on the first microelectronic device and to the at least one bond pad on the second microelectronic device, wherein the bond wire extends through the at least one second microelectronic device opening.

In Example 10, the subject matter of Example 9 can optionally include forming the second microelectronic device with the at least one bond pad in or on the second microelectronic device first surface comprising forming the second microelectronic device having a pair of bond pads on opposing sides of the at least one opening, and forming a short with a conductive trace extending between the pair of bond pads.

In Example 11, the subject matter of Example 9 can optionally include forming the second microelectronic device with the at least one opening through the second microelectronic device comprising forming the second microelectronic device with a pair of openings on opposing sides of the at least one bond pad of the second microelectronic device, and wherein electrically attaching the at least one bond wire comprises electrically attaching the at least one bond wire through one opening of the pair of openings.

In Example 12, the subject matter of Example 9 can optionally include forming the first microelectronic device with the at least one bond pad in or on the first microelectronic device first surface comprising forming the first microelectronic device with a plurality of bond pads in or on the first microelectronic device first surface; forming the second microelectronic device with the at least one bond pad in or on the second microelectronic device first surface comprising forming the second microelectronic device with a plurality of bond pads in or on the second microelectronic device first surface, and wherein the opening through the second microelectronic device comprises a single opening; and electrically attaching at least one bond wire to the at least one bond pad on the first microelectronic device and to the at least one bond pad on the second microelectronic device comprising electrically attaching a plurality of bond wires, wherein the plurality of bond wires extend through the single opening to form electrical connections between the plurality of bond pads in or on the first microelectronic device first surface and corresponding bond pads of the plurality bond pads in or on the second microelectronic device first surface.

In Example 13, the subject matter of any of Examples 9 to 12 can optionally include forming the first microelectronic device comprising forming a first microelectronic die and wherein forming the second microelectronic device comprises forming a second microelectronic die.

In Example 14, the subject matter of any of Examples 9 to 12 can optionally include forming the first microelectronic device comprising forming a microelectronic substrate and wherein forming the second microelectronic device comprises forming a microelectronic die.

In Example 15, the subject matter of any of Example 9 to 12 can optionally include forming the first microelectronic device comprising forming a first microelectronic wafer, and wherein forming the second microelectronic device comprises forming a second microelectronic wafer.

In Example 16, the subject matter of Example 15 can optionally include the at least one opening being formed outside a microelectronic die area on the second microelectronic wafer.

In Example 17, an electronic system may comprise a board; and a microelectronic package attached to the board, wherein the microelectronic package includes a first microelectronic device having a first surface and an opposing second surface, wherein the first microelectronic device includes at least one bond pad in or on the first microelectronic device first surface; a second microelectronic device having a first surface and an opposing second surface, wherein the second microelectronic device second surface is attached to the first microelectronic device first surface, wherein the second microelectronic device includes at least one bond pad in or on the second microelectronic device first surface, and wherein at least one opening extends through the second microelectronic device from the second microelectronic device first surface to the second microelectronic device second surface; and at least one bond wire electrically attached to the at least one bond pad on the first microelectronic device and to the at least one bond pad on the second microelectronic device, wherein the bond wire extends through the at least one second microelectronic device opening.

In Example 18, the subject matter of Example 17 can optionally include the at least one bond pad in or on the second microelectronic device first surface comprising a pair of bond pads on opposing sides of the at least one opening, and wherein the pair of bond pads are shorted with a conductive trace extending between the pair of bond pads.

In Example 19, the subject matter of Example 17 can optionally include the at least one opening through the second microelectronic device comprises a pair of openings on opposing sides of the at least one bond pad of the second microelectronic device, and wherein the at least one bond wire extends through one opening of the pair of openings.

In Example 20, the subject matter of Example 17 can optionally include the at least one bond pad in or on the first microelectronic device first surface comprising a plurality of bond pads; the at least one bond pad of the second microelectronic device comprising a plurality of bond pads and wherein the opening through the second microelectronic device comprises a single opening; and the at least one bond wire comprising a plurality of bond wires, wherein the plurality of bond wires extend through the single opening to form electrical connections between the plurality of bond pads in or on the first microelectronic device first surface and corresponding bond pads of the plurality bond pads in or on the second microelectronic device first surface.

In Example 21, the subject matter of any of Examples 17 to 20 can optionally include the first microelectronic device comprising a first microelectronic die and wherein the second microelectronic device comprises a second microelectronic die.

In Example 22, the subject matter of any of Examples 17 to 20 can optionally include the first microelectronic device comprising a microelectronic substrate and wherein the second microelectronic device comprises a microelectronic die.

In Example 23, the subject matter of any of Examples 17 to 20 can optionally include the first microelectronic device comprising a first microelectronic wafer and wherein the second microelectronic device comprises a second microelectronic wafer.

In Example 24, the subject matter of Example 23 can optionally include the at least one opening being outside a microelectronic die area on the second microelectronic wafer.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic package, comprising:
a first microelectronic device having a first surface and an opposing second surface, wherein the first microelectronic device includes at least one bond pad in or on the first microelectronic device first surface;
a second microelectronic device having a first surface and an opposing second surface, wherein the second microelectronic device second surface is attached to the first microelectronic device first surface, wherein the second microelectronic device includes at least one bond pad in or on the second microelectronic device first surface, and wherein at least one opening extends through the second microelectronic device from the second microelectronic device first surface to the second microelectronic device second surface; and
at least one bond wire electrically attached to the at least one bond pad on the first microelectronic device and to the at least one bond pad on the second microelectronic device, wherein the bond wire extends through the at least one second microelectronic device opening;
wherein the at least one bond pad in or on the second microelectronic device first surface comprises a pair of bond pads on opposing sides of the at least one opening, and wherein the pair of bond pads are shorted with a conductive trace extending between the pair of bond pads.

2. The microelectronic package of claim 1, wherein the first microelectronic device comprises one of a microelectronic die, a microelectronic substrate, and a microelectronic wafer; and wherein the second microelectronic device comprises one of a microelectronic die, a microelectronic substrate, and a microelectronic wafer.

3. A microelectronic package, comprising:
a first microelectronic device having a first surface and an opposing second surface, wherein the first microelectronic device includes at least one bond pad in or on the first microelectronic device first surface;
a second microelectronic device having a first surface and an opposing second surface, wherein the second microelectronic device second surface is attached to the first microelectronic device first surface, wherein the second microelectronic device includes at least one bond pad in or on the second microelectronic device first surface, and wherein at least one opening extends through the second microelectronic device from the second microelectronic device first surface to the second microelectronic device second surface; and
at least one bond wire electrically attached to the at least one bond pad on the first microelectronic device and to the at least one bond pad on the second microelectronic device, wherein the bond wire extends through the at least one second microelectronic device opening;
wherein the at least one bond pad in or on the first microelectronic device first surface comprises a plurality of bond pads;
wherein the at least one bond pad of the second microelectronic device comprises a plurality of bond pads and wherein the opening through the second microelectronic device comprises a single opening; and
wherein the at least one bond wire comprises a plurality of bond wires, wherein the plurality of bond wires extend through the single opening to form electrical connections between the plurality of bond pads in or on the first microelectronic device first surface and corresponding bonds pad of the plurality bond pads in or on the second microelectronic device first surface.

4. The microelectronic package of claim 3, wherein the first microelectronic device comprises one of a microelectronic die, a microelectronic substrate, and a microelectronic wafer; and wherein the second microelectronic device comprises one of a microelectronic die, a microelectronic substrate, and a microelectronic wafer.

5. A microelectronic package, comprising:
a first microelectronic device having a first surface and an opposing second surface, wherein the first microelectronic device includes at least one bond pad in or on the first microelectronic device first surface;
a second microelectronic device having a first surface and an opposing second surface, wherein the second microelectronic device second surface is attached to the first microelectronic device first surface, wherein the second microelectronic device includes at least one bond pad in or on the second microelectronic device first surface, and wherein at least one opening extends through the second microelectronic device from the second microelectronic device first surface to the second microelectronic device second surface; and
at least one bond wire electrically attached to the at least one bond pad on the first microelectronic device and to the at least one bond pad on the second microelectronic device, wherein the bond wire extends through the at least one second microelectronic device opening;
wherein the first microelectronic device comprises a first microelectronic wafer, wherein the second microelectronic device comprises a second microelectronic wafer, and wherein the at least one opening is outside a microelectronic die area on the second microelectronic wafer.

6. A method of forming a microelectronic package, comprising:
forming a first microelectronic device having a first surface and an opposing second surface, wherein the first microelectronic device includes at least one bond pad in or on the first microelectronic device first surface;
forming a second microelectronic device having a first surface and an opposing second surface, wherein the second microelectronic device second surface is attached to the first microelectronic device first surface, wherein the second microelectronic device includes at least one bond pad in or on the second microelectronic device first surface, and wherein at least one opening extending through the second microelectronic device from the second microelectronic device first surface to the second microelectronic device second surface; and
electrically attaching at least one bond wire to the at least one bond pad on the first microelectronic device and to the at least one bond pad on the second microelectronic device, wherein the bond wire extends through the at least one second microelectronic device opening;
wherein forming the second microelectronic device with the at least one bond pad in or on the second microelectronic device first surface comprises forming the second microelectronic device having a pair of bond pads on opposing sides of the at least one opening, and forming a short with a conductive trace extending between the pair of bond pads.

7. The method of claim 6, wherein forming the first microelectronic device comprises forming one of a microelectronic die, a microelectronic substrate, and a microelectronic wafer; and wherein forming the second microelectronic device comprises forming on of a microelectronic die, a microelectronic substrate, and a microelectronic wafer.

8. A The method of forming a microelectronic package, comprising:
  forming a first microelectronic device having a first surface and an opposing second surface, wherein the first microelectronic device includes at least one bond pad in or on the first microelectronic device first surface;
  forming a second microelectronic device having a first surface and an opposing second surface, wherein the second microelectronic device second surface is attached to the first microelectronic device first surface, wherein the second microelectronic device includes at least one bond pad in or on the second microelectronic device first surface, and wherein at least one opening extending through the second microelectronic device from the second microelectronic device first surface to the second microelectronic device second surface; and
  electrically attaching at least one bond wire to the at least one bond pad on the first microelectronic device and to the at least one bond pad on the second microelectronic device, wherein the bond wire extends through the at least one second microelectronic device opening;
  wherein forming the first microelectronic device with the at least one bond pad in or on the first microelectronic device first surface comprises forming the first microelectronic device with a plurality of bond pads in or on the first microelectronic device first surface;
  wherein forming the second microelectronic device with the at least one bond pad in or on the second microelectronic device first surface comprises forming the second microelectronic device with a plurality of bond pads in or on the second microelectronic device first surface, and wherein the opening through the second microelectronic device comprises a single opening; and
  wherein electrically attaching at least one bond wire to the at least one bond pad on the first microelectronic device and to the at least one bond pad on the second microelectronic device comprises electrically attaching a plurality of bond wires, wherein the plurality of bond wires extend through the single opening to form electrical connections between the plurality of bond pads in or on the first microelectronic device first surface and corresponding bond pads of the plurality bond pads in or on the second microelectronic device first surface.

9. The method of claim 8, wherein forming the first microelectronic device comprises forming one of a microelectronic die, a microelectronic substrate, and a microelectronic wafer; and wherein forming the second microelectronic device comprises forming one of a microelectronic die, a microelectronic substrate, and a microelectronic wafer.

10. A method of forming a microelectronic package, comprising:
  forming a first microelectronic device having a first surface and an opposing second surface, wherein the first microelectronic device includes at least one bond pad in or on the first microelectronic device first surface;
  forming a second microelectronic device having a first surface and an opposing second surface, wherein the second microelectronic device second surface is attached to the first microelectronic device first surface, wherein the second microelectronic device includes at least one bond pad in or on the second microelectronic device first surface, and wherein at least one opening extending through the second microelectronic device from the second microelectronic device first surface to the second microelectronic device second surface; and
  electrically attaching at least one bond wire to the at least one bond pad on the first microelectronic device and to the at least one bond pad on the second microelectronic device, wherein the bond wire extends through the at least one second microelectronic device opening;
  wherein forming the first microelectronic device comprises forming a first microelectronic wafer, wherein forming the second microelectronic device comprises forming a second microelectronic wafer, and wherein the at least one opening is formed outside a microelectronic die area on the second microelectronic wafer.

11. An electronic system, comprising:
  a board; and
  a microelectronic package attached to the board, wherein the microelectronic package includes:
    a first microelectronic device having a first surface and an opposing second surface, wherein the first microelectronic device includes at least one bond pad in or on the first microelectronic device first surface;
    a second microelectronic device having a first surface and an opposing second surface, wherein the second microelectronic device second surface is attached to the first microelectronic device first surface, wherein the second microelectronic device includes at least one bond pad in or on the second microelectronic device first surface, and wherein at least one opening extending through the second microelectronic device from the second microelectronic device first surface to the second microelectronic device second surface; and
    at least one bond wire electrically attached to the at least one bond pad on the first microelectronic device and to the at least one bond pad on the second microelectronic device, wherein the bond wire extends through the at least one second microelectronic device opening:
    wherein the at least one bond pad in or on the second microelectronic device first surface comprises a pair of bond pads on opposing sides of the at least one opening, and wherein the pair of bond pads are shorted with a conductive trace extending between the pair of bond pads.

12. The electronic system of claim 11, wherein the first microelectronic device comprises one of a microelectronic die, a microelectronic substrate, and a microelectronic wafer; and wherein the second microelectronic device comprises one of a microelectronic die, a microelectronic substrate, and a microelectronic wafer.

13. An electronic system, comprising:
  a board; and
  a microelectronic package attached to the board, wherein the microelectronic package includes:
    a first microelectronic device having a first surface and an opposing second surface, wherein the first microelectronic device includes at least one bond pad in or on the first microelectronic device first surface;

a second microelectronic device having a first surface and an opposing second surface, wherein the second microelectronic device second surface is attached to the first microelectronic device first surface, wherein the second microelectronic device includes at least one bond pad in or on the second microelectronic device first surface, and wherein at least one opening extending through the second microelectronic device from the second microelectronic device first surface to the second microelectronic device second surface; and at least one bond wire electrically attached to the at least one bond pad on the first microelectronic device and to the at least one bond pad on the second microelectronic device, wherein the bond wire extends through the at least one second microelectronic device opening;

wherein the at least one bond pad in or on the first microelectronic device first surface comprises a plurality of bond pads;

wherein the at least one bond pad of the second microelectronic device comprises a plurality of bond pads and wherein the opening through the second microelectronic device comprises a single opening; and wherein the at least one bond wire comprises a plurality of bond wires, wherein the plurality of bond wires extend through the single opening to form electrical connections between the plurality of bond pads in or on the first microelectronic device first surface and corresponding bond pads of the plurality bond pads in or on the second microelectronic device first surface.

14. The electronic system of claim 13, wherein the first microelectronic device comprises one of a microelectronic die, a microelectronic substrate, and a microelectronic wafer; and wherein the second microelectronic device comprises one of a microelectronic die, a microelectronic substrate, and a microelectronic wafer.

15. An electronic system, comprising:

a board; and a microelectronic package attached to the board, wherein the microelectronic package includes:

a first microelectronic device having a first surface and an opposing second surface, wherein the first microelectronic device includes at least one bond pad in or on the first microelectronic device first surface;

a second microelectronic device having a first surface and an opposing second surface, wherein the second microelectronic device second surface is attached to the first microelectronic device first surface, wherein the second microelectronic device includes at least one bond pad in or on the second microelectronic device first surface, and wherein at least one opening extending through the second microelectronic device from the second microelectronic device first surface to the second microelectronic device second surface; and at least one bond wire electrically attached to the at least one bond pad on the first microelectronic device and to the at least one bond pad on the second microelectronic device, wherein the bond wire extends through the at least one second microelectronic device opening;

wherein the first microelectronic device comprises a first microelectronic wafer, wherein the second microelectronic device comprises a second microelectronic wafer, and wherein the at least one opening is outside a microelectronic die area on the second microelectronic wafer.

* * * * *